United States Patent
Nishizawa et al.

(10) Patent No.: US 8,932,098 B2
(45) Date of Patent: Jan. 13, 2015

(54) RELIEF PRINTING PLATE AND METHOD FOR PRODUCING ORGANIC EL DEVICE USING THE SAME

(71) Applicant: Toppan Printing Co., Ltd., Tokyo (JP)

(72) Inventors: Makoto Nishizawa, Tokyo (JP); Hiroyuki Chinone, Tokyo (JP)

(73) Assignee: Toppan Printing Co., Ltd. (JP)

(*) Notice: Subject to any disclaimer, the term of this patent is extended or adjusted under 35 U.S.C. 154(b) by 30 days.

(21) Appl. No.: 13/763,364

(22) Filed: Feb. 8, 2013

(65) Prior Publication Data
US 2013/0189896 A1    Jul. 25, 2013

Related U.S. Application Data

(63) Continuation of application No. PCT/JP2011/070132, filed on Sep. 5, 2011.

(30) Foreign Application Priority Data

Sep. 27, 2010 (JP) ................. 2010-215499

(51) Int. Cl.
*H01J 9/00* (2006.01)
*H01J 9/24* (2006.01)
(Continued)

(52) U.S. Cl.
CPC .............. *B41N 1/12* (2013.01); *H01L 51/0002* (2013.01); *H05B 33/10* (2013.01); *H01L 51/56* (2013.01)
USPC ................. 445/24; 445/23; 445/25; 313/498; 313/504; 313/506

(58) Field of Classification Search
CPC ............ H01L 51/0005; H01L 51/0004; H01L 27/3246; H01L 51/5012; H01L 27/3283; H01L 27/3211; H01L 51/56
USPC ................................ 445/23–25; 313/498–512
See application file for complete search history.

(56) References Cited

U.S. PATENT DOCUMENTS 7,686,665 B2 * 3/2010 Nakamura et al. ............... 445/24
8,324,806 B2 * 12/2012 Kaneta et al. .................. 313/504
(Continued)

FOREIGN PATENT DOCUMENTS

| JP | 10-012377 | 1/1998 |
| JP | 2001-093668 | 4/2001 |

(Continued)

OTHER PUBLICATIONS

International Preliminary Report on Patentability for PCT/JP2011/070132, dated Apr. 25, 2013, 6 pgs.

*Primary Examiner* — Thomas A Hollweg
*Assistant Examiner* — Kevin Quarterman
(74) *Attorney, Agent, or Firm* — Squire Patton Boggs (US) LLP

(57) ABSTRACT

A method is provided for forming a uniform light emitting medium layer by a relief printing method without occurrence of printing defects. The method includes producing an organic EL device containing a substrate having thereon a pixel electrode, pixel regions that are demarcated with a partition wall on the pixel electrode, a light emitting medium layer having a light emitting layer containing at least an organic light emitting material on the pixel regions, and a counter electrode facing the pixel electrode. The method can have a step of forming at least one layer constituting the light emitting medium layer by a relief printing method, and the ink used in the relief printing method being transferred from two or more adjacent relief patterns within one of the pixel regions and being integrated by flow thereof to form the light emitting medium layer.

10 Claims, 11 Drawing Sheets

(51) Int. Cl.
  *B41N 1/12* (2006.01)
  *H01L 51/00* (2006.01)
  *H05B 33/10* (2006.01)
  *H01L 51/56* (2006.01)

(56) References Cited

U.S. PATENT DOCUMENTS

2004/0077113 A1* 4/2004 Yamazaki et al. ............. 438/29
2004/0185188 A1* 9/2004 Amano et al. ............... 428/1.51
2007/0087645 A1* 4/2007 Tsujii et al. .................... 445/24
2009/0322210 A1* 12/2009 Yokoo ............................ 313/504
2010/0173553 A1* 7/2010 Tanaka et al. ................. 445/24
2010/0289026 A1* 11/2010 Yamazaki et al. ............. 257/59

FOREIGN PATENT DOCUMENTS

JP 2001-155858 6/2001
JP 2004-237545 8/2004

* cited by examiner

RELIEF PRINTING PLATE AND METHOD FOR PRODUCING ORGANIC EL DEVICE USING THE SAME

CROSS-REFERENCE TO RELATED APPLICATION

This application is a continuation of International Application No. PCT/JP2011/070132, filed Sep. 5, 2011, which is incorporated herein by reference.

BACKGROUND OF THE INVENTION

1. Field of the Invention

The present invention relates to an organic EL device having an organic luminescent layer that is formed by a relief printing method, a method for producing the same, and a relief printing plate used therefor.

2. Related Art

An organic EL device is a light emitting device that has a structure having an organic light emitting layer formed of an organic light emitting material between an anode and a cathode facing each other, and positive holes and electrons are injected to the organic light emitting layer from the anode and the cathode by applying a voltage, respectively, and are recombined therein to emit light. The thickness of the organic light emitting layer is an important factor for emitting light with high efficiency, and the thickness is necessarily controlled within a range of from several nm to several tens nm. In the case where an organic EL device is used as a display device, it is necessary to employ a technique for patterning the device with high definition.

The organic light emitting material used in the organic light emitting layer is classified into a low molecular weight material and a high molecular weight material, and the formation method of the organic light emitting layer varies depending on the kind of the organic light emitting material.

In general, the low molecular weight material is formed into a thin film on a substrate by a resistance heating vapor deposition method (vacuum vapor deposition method) or the like. In the case where a full color display device is produced with the organic EL device, light emitting materials with plural light emitting colors are vapor-deposited on pixel portions respectively with masks having patterns corresponding to the shapes of the pixels of the respective colors. This method is excellent for forming a uniform thin film but has a problem that the pattern accuracy of the mask is difficult to maintain on forming on a large substrate.

The organic light emitting material in the form of a high molecular weight material is generally dissolved or dispersed in a solvent to form an ink, which is formed into a thin film by a wet coating method. Examples of the wet coating method include a spin coating method, a bar coating method, an extrusion coating method and a dip coating method, but these methods are difficult to use for patterning or coating colors distinctly, and a pattern printing method, such as an ink-jet method and a printing method is necessarily employed for patterning with high definition.

For example, in a pattern forming method by an ink-jet method disclosed in JP-A-10-12377, an organic light emitting material dissolved in a solvent is ejected from an ink-jet nozzle onto a substrate and dried on the substrate to form a pattern. However, ink droplets ejected from the nozzle are in a spherical shape, and thus the ink spreads to a circular shape on impacting on the substrate, which may cause a problem that the pattern shape thus formed lacks linearity, or the pattern lacks linearity due to deteriorated impact accuracy.

Examples of the pattern formation method by a printing method include a relief printing method, an inversion printing method and a screen printing method. The organic EL device or a display often employs a glass substrate as a substrate thereof, for which a method using a hard printing plate, such as a metal printing plate, for example, a gravure printing method, is not suitable. Accordingly, such printing methods may be properly applied as a printing method using a rubber printing plate having elasticity, an offset printing method using a rubber printing blanket, and a relief printing method using a photosensitive resin printing plate formed mainly of rubber or other resins having elasticity. In practice, a pattern printing method by offset printing (JP-A-2001-93668), a pattern printing method by relief printing (JP-A-2001-155858) and the like have been proposed as attempts of the printing methods.

As an example of a process for forming an organic light emitting layer of an organic EL device by a relief printing method, an organic light emitting material is dissolved or dispersed in a solvent to form an ink, which is coated on a surface of an anilox roll having fine pores. An excessive portion of the ink on the surface of the anilox roll is scraped out with a doctor blade for uniformizing the coated amount of the ink per unit area of the anilox roll. The ink on the anilox roll is then transferred to an image forming part of a printing plate, in which the image forming part is provided corresponding to the shape of the pixels of the organic EL device, and finally the ink thin film on the image forming part of the printing plate is transferred onto the substrate to form the organic light emitting layer of the organic EL device.

FIG. 9 is a schematic cross sectional view showing an example of a printing process for forming a light emitting part by a relief printing method. In FIG. 9, an ink pan 101 stores an ink containing an organic light emitting material and the like dissolved or dispersed in a solvent. The ink is fed to an anilox roll 103 in the ink pan 101, and the excessive portion of the ink thereon is scraped out with a doctor blade 102, thereby accumulating the ink only inside the pores. The ink in the pores is transferred onto an image forming part of a relief printing plate 104 wound on a plate cylinder 105, which is rotated against the anilox roll 103, thereby forming a patterned ink thin film thereon. The patterned ink thin film formed on the image forming part is further transferred onto a substrate 106, which is moved against the plate cylinder 105, thereby forming an intended light emitting part at the position on the substrate where the light emitting part is to be formed.

In the case where an organic EL device is produced by a printing method, the pattern of the image forming part on the printing plate for forming a light emitting part contains plural image forming parts that form light emitting parts emitting light in the same color among plural light emitting parts constituting the respective elements of the organic EL device, and plural printing plates having such a structure are provided for each colors of light to be emitted, with which the light emitting parts emitting light in the colors respectively are sequentially printed, thereby providing the organic light emitting layer.

FIGS. 6A to 6D are schematic cross sectional views showing an ordinary printing process by a relief printing method, and the printing process is described with reference thereto. A printing plate is inked (FIG. 6A) and then pressed onto a transfer substrate 201 (FIG. 6B). At this time, a relief pattern 203 of the plate is pressed onto the transfer substrate, and the ink 202 thus squashed spreads outside the relief pattern of the plate. On removing the printing plate off from the transfer substrate, the ink is separated into the printing plate and the transfer substrate due to the viscous behavior of the ink (FIG.

6C). Thereafter, the ink thus transferred to the transfer substrate is leveled to form a uniform pattern (FIG. 6D). The printed line width of the pattern thus formed by the process tends to be thicker than the relief pattern width of the plate by such an extent that the ink on the relief pattern is squashed and spread from the relief pattern.

In the case where the ink thus transferred in the aforementioned printing process is not sufficiently leveled, printing defects may occur, such as a cupping phenomenon, in which the ink is not transferred to the center portion of the printed line, and a marginal phenomenon, in which the ink is not transferred to the outer portion of the printed line. When the phenomena occur, the organic material layer may have uneven thickness within a pixel, which causes light emission unevenness. The states of occurrence of the phenomena are shown in FIGS. 7A, 7B, 8A and 8B. FIGS. 7A and 7B are schematic cross sectional views showing the cupping phenomenon, and FIGS. 8A and 8B are schematic cross sectional views showing the marginal phenomenon.

These phenomena may occur in the case where the relief pattern of the plate has a large width, and the case where the ink has large viscosity. Even though the phenomena are not observed on printing for several sheets, they tend to occur on performing continuous printing.

Accordingly, for producing an organic EL device continuously by a relief printing method stably, the ordinary relief printing plate has problems in the size of the transfer area of the printed material and in the kind and physical properties of the ink.

SUMMARY OF THE INVENTION

The invention has been made for solving the problems, and an object thereof is to provide an organic EL device having suppressed light emission unevenness, in which on producing a light emitting medium layer of the organic EL device by a relief printing method using an organic material ink, printing defects may not occur to form a uniform light emitting medium layer even when a high viscosity ink is used or the ink is printed on a pixel pattern having a large width, or even when a large number of sheets are printed continuously a method for producing the organic EL device, and a relief printing plate used therein.

As a result of investigations made on a relief pattern shape of a relief printing plate for solving the problems, the invention has been completed.

The invention relates to, as a first aspect, a method for producing an organic EL device containing a substrate having thereon a pixel electrode, pixel regions that are demarcated with a partition wall on the pixel electrode, a light emitting medium layer having a light emitting layer containing at least an organic light emitting material on the pixel regions, and a counter electrode facing the pixel electrode, the method containing a step of transferring an ink containing a light emitting medium material and a solvent to the pixel regions by a relief printing method to form the light emitting medium layer, the ink used in the relief printing method being transferred from two or more adjacent relief patterns within one of the pixel regions and being integrated by flow thereof to form the light emitting medium layer.

The invention relates to, as a second aspect, the method for producing an organic EL device according to the first aspect, wherein the ink has a viscosity of from 5 to 120 mPa·s.

The invention relates to, as a third aspect, a relief printing plate used in the method for producing an organic EL device according to the first or second aspect, the relief printing plate containing at least a plate substrate, the two or more adjacent relief patterns formed on the plate substrate, and a relief pattern group containing the relief patterns.

The invention relates to, as a fourth aspect, the relief printing plate according to the third aspect, wherein the relief patterns have a height of 10 μm or more.

The invention relates to, as a fifth aspect, the relief printing plate according to the third or fourth aspect, wherein a distance between the adjacent relief patterns is from 10 to 40 μm.

The invention relates to, as a sixth aspect, the relief printing plate according to one of the third to fifth aspects, wherein the relief pattern group has a width of from 60 to 500 μm.

According to the invention, at least one layer containing an organic material of a light emitting medium layer may be uniformly formed by a relief printing method by using a relief printing plate having plural adjacent relief patterns, thereby enabling production of an organic EL device capable of providing light emission without unevenness.

DESCRIPTION OF EMBODIMENTS

Embodiments of the invention will be described below with reference to the attached drawings, but the invention is not limited thereto.

Figure 1:
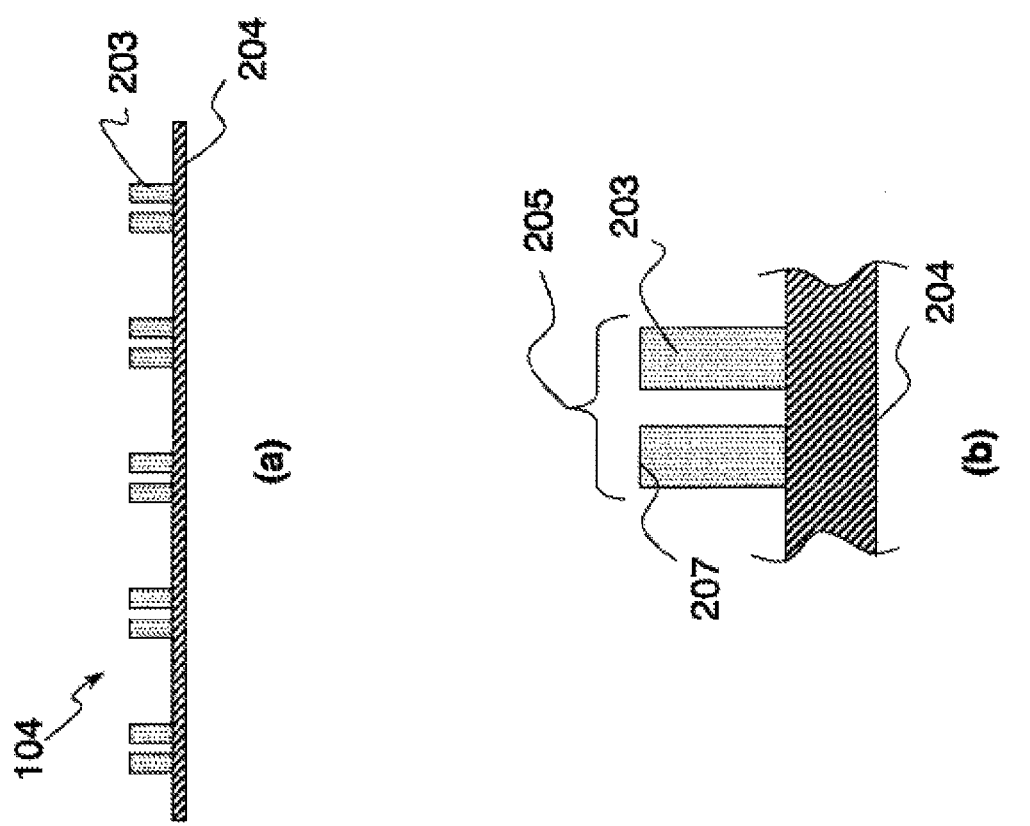
FIG. 1A is a schematic cross sectional view showing an example of a relief printing plate according to the invention.
FIG. 1B is an enlarged view of a part of a relief printing plate according to the invention.
Figure 2:
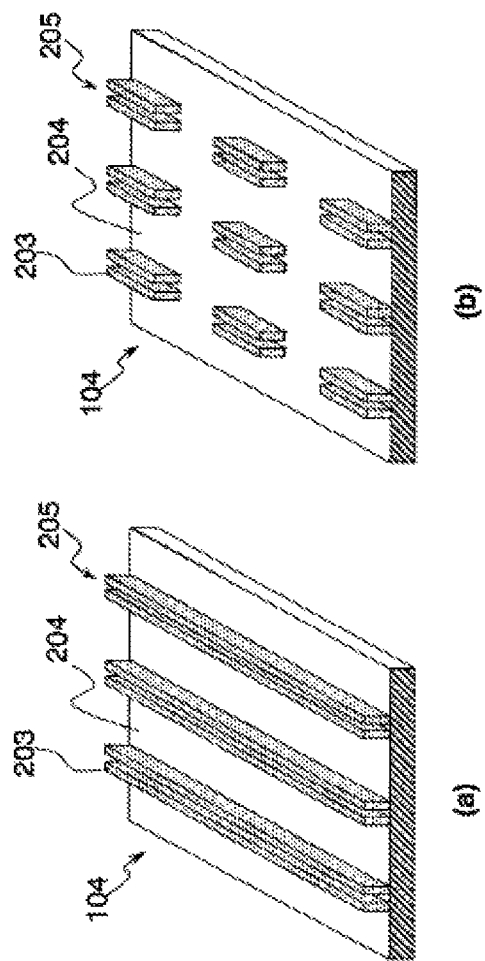
FIG. 2A is a schematic cross sectional perspective view showing an example of a relief printing plate according to the invention.
FIG. 2B is a schematic cross sectional perspective view showing another example of a relief printing plate according to the invention.

FIGS. 1A and 1B are schematic cross sectional views showing an example of a relief printing plate according to the invention. A relief pattern 203 formed with a resin layer is formed on a substrate 204, and a relief pattern group 205 is formed with at least two of the relief patterns adjacent to each other. The relief pattern 203 may be formed continuously to the adjacent relief pattern on the substrate as shown in FIG. 2A or may be formed independently from the adjacent relief pattern on the substrate as shown in FIG. 2B, and both the cases may be employed in the invention. The substrate 204 may be a laminated material containing a layer, which imparts a visible ray antireflection effect, an ultraviolet ray antireflection effect, water resistance, oil resistance, water repellency, adhesiveness and the like, added between the relief patterns 203 and the substrate 204, if necessary. The relief pattern group 205 formed in the relief printing plate of the invention is formed of at least two relief patterns 203 adjacent to each other. The relief patterns 203 adjacent to each other are preferably in parallel to each other from the standpoint of the strength and the easiness of production thereof.

The substrate 204, on which the relief patterns 203 are formed, as the plate material used in the relief printing plate of the invention may be any material that has a mechanical strength withstanding printing, and examples thereof include a known synthetic resin, such as polyethylene, polystyrene, polybutadiene, polyvinyl chloride, polyvinylidene chloride, polyvinyl acetate, polyamide, polyether sulfone, polyethylene terephthalate, polyethylene naphthalate, polyether sulfone and polyvinyl alcohol, a known metal, such as iron, copper and aluminum, and a laminated material thereof. Among these, a material that has high dimensional stability is preferred, and a metal is preferably used as such a substrate. Examples of the metal include iron, aluminum, copper, zinc, nickel, titanium, chromium, gold, silver, an alloy thereof, and a laminated material thereof, and a steel substrate composed mainly of iron and an aluminum substrate are particularly preferably used from the standpoint of the productivity and the economical efficiency.

A polymer that is one component of a resin for forming the relief pattern 203 of the relief printing plate of the invention may be at least one selected from rubber, such as nitrile rubber, silicone rubber, isoprene rubber, styrene-butadiene rubber, butadiene rubber, chloroprene rubber, butyl rubber, acrylonitrile rubber, ethylene-propylene rubber and urethane rubber, a synthetic resin and a copolymer thereof, such as polyethylene, polystyrene, polybutadiene, polyvinyl chloride, polyvinylidene chloride, polyvinyl acetate, polyamide, polyurethane, polyether sulfone, polyethylene terephthalate, polyethylene naphthalate, polyether sulfone and polyvinyl alcohol, a natural polymer, such as cellulose, and the like, and in the case where a coating composition containing an organic light emitting material is coated, a fluorine elastomer and a fluorine resin, such as polytetrafluoroethylene, polyvinylidene fluoride, polyhexafluorovinylidene and a copolymer thereof, are preferred from the standpoint of solvent resistance against an organic solvent.

A visible light antireflection layer may be provided for facilitating detection of defects of the relief part with visible light through absorption or diffused reflection of visible light, and examples of the material therefor include a metal oxide that diffusely reflects light, such as silicon oxide and titanium oxide, and a material that has an absorption band in the visible region, such as carbon black and a known pigment.

The solvent resistance may be imparted by containing at least one material that is soluble in a water soluble solvent, such as polyvinyl alcohol, polyamide, polyurethane, cellulose acetate succinate, partially saponified polyvinyl acetate, cation type piperazine-containing polyamide, and derivatives thereof, and at least one selected therefrom is preferably used.

The relief pattern 203 formed with the resin layer in the invention may be formed by various pattern forming methods, such as a photolithography method using a positive photosensitive resin, a photolithography method using a negative photosensitive resin, an injection molding method, a relief printing method, an intaglio printing method, a planographic printing method, a stencil printing method and a laser ablation method. A photolithography method using a photosensitive resin is preferred from the standpoint of the high definition of the pattern, and a photolithography method using a negative photosensitive resin capable of forming a relief printing plate having a demanded accuracy is most preferred.

In the case where a photolithography method using a photosensitive resin is applied to the production of the relief pattern 203, it is most preferred that the relief pattern 203 of the relief printing plate is formed from a plate photosensitive resin laminated material that contains a substrate layer and a photosensitive resin layer laminated sequentially. The photosensitive resin layer may be formed by a known method, such as an injection molding method, an extrusion molding method, a lamination method, a bar coating method, a slit coating method and a comma coating method.

The molting method of the plate photosensitive resin laminated material in the invention will be described. In the case where an antireflection layer and the like are formed on the substrate 204, the layers may be formed by a wet coating method, such as bar coating method, a slit coating method, a spray coating method, a flexographic coating method and a gravure coating method, or a dry coating method, such as a sputtering method, a vacuum vapor deposition method and a CVD method, to form a laminated body. A photosensitive resin layer is then formed on the laminated body or the substrate 204 by a known method, such as an injection molding method, an extrusion molding method, a lamination method, a bar coating method, a slit coating method and a comma coating method, thereby providing the plate photosensitive resin laminated material.

The pattern shape of the relief printing plate of the invention will be described. In the case where an organic EL device is printed by a relief printing method, the relief pattern 203 of the relief printing plate is necessarily formed corresponding to the pixel region of the organic EL device, and the pattern of the relief printing plate largely depends on the pixel pattern.

Figure 5:
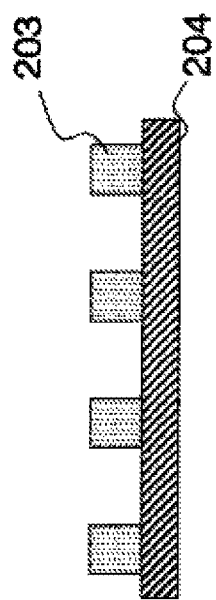
FIG. 5 is a schematic cross sectional view showing an ordinary relief printing plate.
Figure 6:
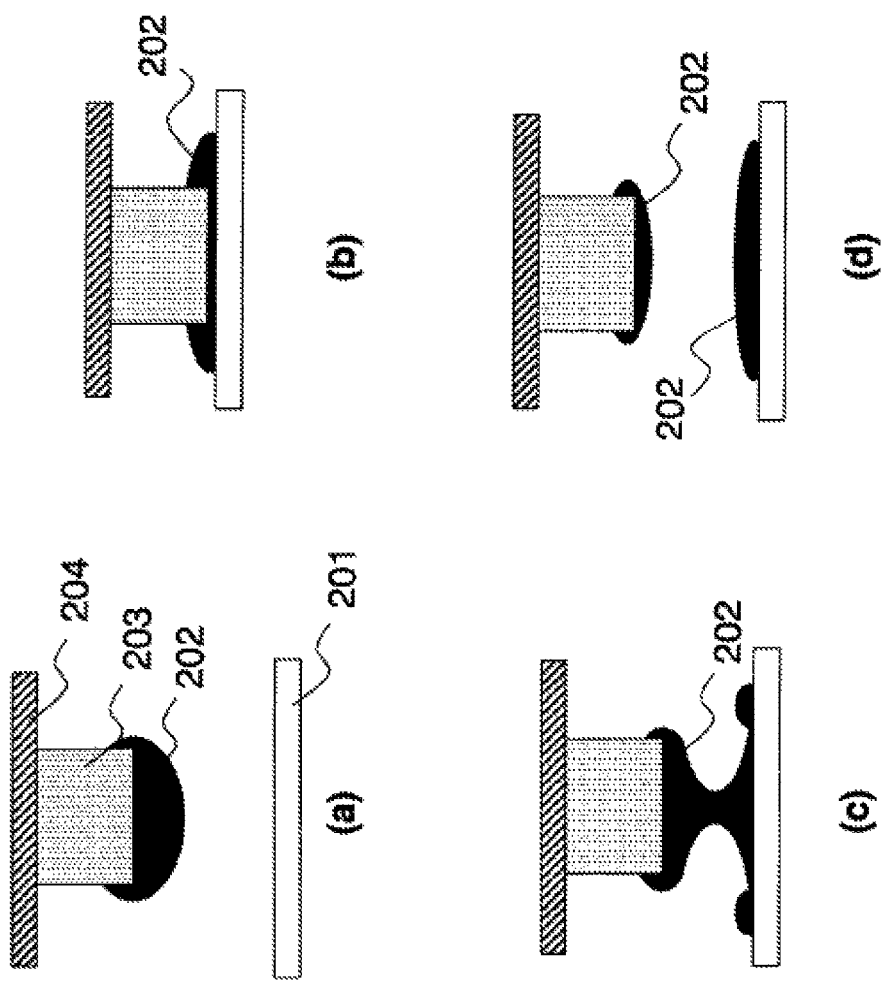
FIGS. 6A to 6D are schematic cross sectional views showing a printing process using an ordinary relief printing method.

FIGS. 1A and 1B are schematic cross sectional views showing an example of the relief printing plate of the invention, FIGS. 4A to 4D are schematic cross sectional views showing an example of a printing process using the relief printing plate according to the invention, FIG. 5 is a schematic cross sectional view showing an ordinary relief printing plate, and FIGS. 6A to 6D are schematic cross sectional views showing a printing process using an ordinary relief printing method.

Figure 7:
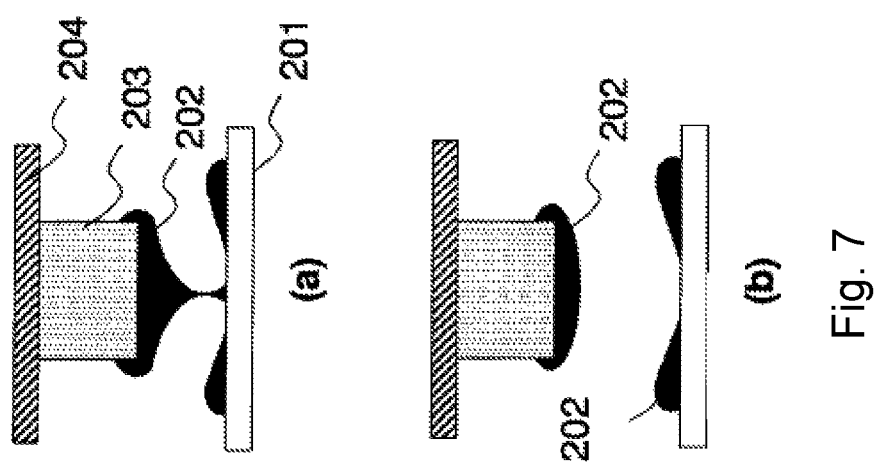
FIGS. 7A and 7B are schematic cross sectional views showing a state of a relief printing plate and a substrate as a printed matter in a printing process using an ordinary relief printing method during printing and after printing, respectively, for showing a cupping phenomenon.
Figure 8:
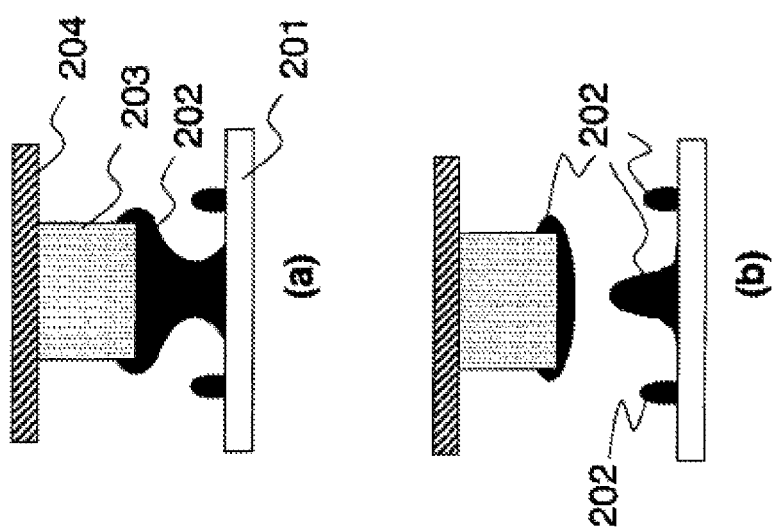
FIGS. 8A and 8B are schematic cross sectional views showing a state of a relief printing plate and a substrate as a printed matter in a printing process using an ordinary relief printing method during printing and after printing, respectively, for showing a marginal phenomenon.

By printing by a relief printing method, an ink is transferred to a substrate with a larger thickness than the line width of the relief pattern 203 as shown in FIGS. 6A to 6D, and for forming a pixel region having a larger width, a relief pattern 203 having a larger line width is necessarily used. However, depending on the ink viscosity and the printing conditions, a printed matter with a line width exceeding 70 μm by a relief printing method using an ordinary relief printing plate shown in FIG. 5 suffers noticeably a printing defect, such as a cupping phenomenon (FIGS. 7A and 7B) and a marginal phenomenon (FIGS. 8A and 8B). Furthermore, in the case where a high viscosity ink is used in a relief printing method, the aforementioned printing defect may occur even within such a line width range that maintains the printing suitability with an ink having ordinary viscosity. The line width referred herein means the width of the relief pattern, i.e., the length in the minor axis direction of the relief pattern.

In the relief printing plate of the invention, plural relief patterns 203 adjacent to each other having a width with printing suitability are provided to form the relief pattern group 205, and on transferring the ink therefrom to the substrate 204, plural portions of the ink are connected by leveling on the substrate, thereby forming a target printed line having a large width (FIGS. 4A to 4D). In this case, the relief patterns 203 for printing on a substrate each have a width with printing suitability, and therefore such printing defects as a cupping phenomenon and a marginal phenomenon, which may occur in an ordinary relief printing plate, may be suppressed even when a transfer pattern with a large width is printed. Consequently, a pattern having a large line width, which may not be formed by an ordinary relief printing method, can be formed by a relief printing method. Furthermore, the printing defects may not occur even when a high viscosity ink is used.

The distance between the relief patterns 203 adjacent to each other in the relief pattern group 205 may be from 10 to 40 μm. The distance between the relief patterns 203 referred herein means the distance between the inner surfaces of the relief patterns 203 adjacent to each other. When the distance between the relief patterns 203, i.e., the adjacent distance, is less than 10 μm, the portions of the ink may be contacted and integrated to each other before transferring due to the too small distance between the facing walls of the relief patterns 203, and the ink may invade the space between the relief patterns 203 due to surface tension or capillary phenomenon. When the ink invades the space between the relief patterns 203, printing defects, such as unevenness in ink transfer amount, may occur in the transferred pattern. When the adjacent distance of the relief patterns 203 exceeds 40 μm, on the other hand, such a printing defect may occur that the portions of the ink may not be connected to each other by transferring and leveling on the substrate, depending on the width of the relief patterns 203 and the viscosity of the ink. In the case where the distance between the relief patterns 203 is a distance with printing suitability, the portions of the ink are connected to each other and levelled into one on transferring when the adjacent distance of the relief patterns 203 is 40 μm or less, and this is desirable. However, the adjacent distance of the relief patterns 203 may be less than 10 μm or larger than 40 μm in the case where the defects do not occur depending on the printing conditions including the viscosity of the ink, the width of the relief patterns 203.

The height of the relief pattern 203, i.e., the vertical length between the top of the relief pattern 203 and the surface of the substrate 204, may be 10 μm or more. When the height is less than 10 μm, the ink on the relief pattern 203 may be in contact with the surface of the substrate 204 and may be entrained into the surface of the substrate in some cases. However, the height of the relief pattern 203 may be less than 10 μm in the case where the problem does not occur depending on the printing conditions.

The width of the relief pattern 203 thus formed may be such a width that has printing suitability, and when the width is 70 μm or less, printing defects may be prevented from occurring. However, the relief pattern 203 having a larger width may be formed in the case where the printing defects are prevented from occurring by controlling the viscosity of the ink and the printing conditions. The width of the relief pattern 203 referred herein means the length in the minor axis direction of the relief pattern 203.

The width of the relief pattern group 205 formed on the relief printing plate of the invention may be from 60 to 500 μm. The width of the relief pattern group referred herein means the length in the minor axis direction of the relief pattern group 205 as an assembly of the plural relief patterns 203 and does not mean the width of the relief pattern 203. When the width of the relief pattern group 205 is less than 60 μm, the width of the individual relief patterns 203 constituting the relief pattern group may be too small, and it may be difficult to produce the relief patterns 203 by a photolithography method. The width of the relief pattern group 205 may be sufficient to be 500 μm or less in consideration of the expected size increase of an organic EL display device, but the line width may be more than 500 μm when the width of the target printing pattern is larger than the current one. In this case, the target line width may be provided by constituting the relief pattern group with plural relief patterns 203 adjacent to each other that each have a width free of the marginal phenomenon and the cupping phenomenon.

Figure 3:
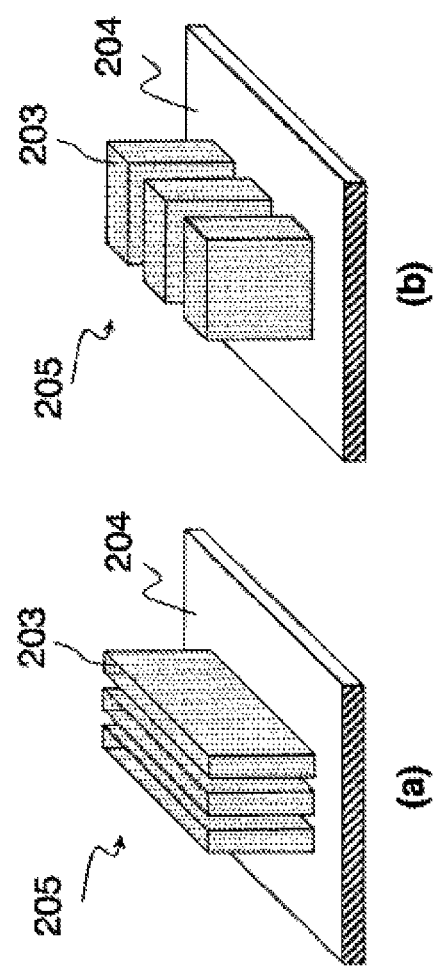
FIG. 3A is a schematic perspective view showing an example of relief patterns formed on a relief printing plate according to the invention.
FIG. 3B is a schematic perspective view showing another example of relief patterns formed on a relief printing plate according to the invention.
Figure 4:
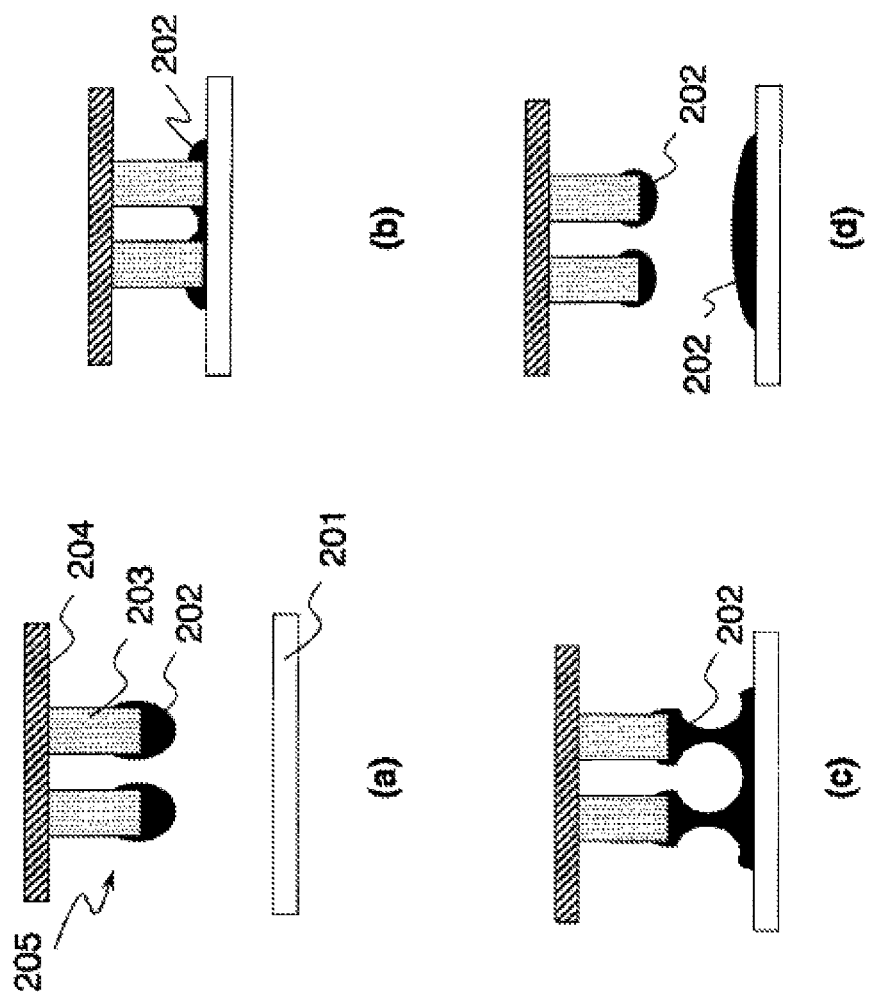
FIGS. 4A to 4D are schematic cross sectional views showing an example of a printing process by a relief printing method using a relief printing plate according to the invention.

The arrangement of the relief patterns 203 inside the relief pattern group 205 may be such an arrangement that the relief patterns 203 are aligned in the major axis direction thereof as shown in FIG. 3A or such an arrangement that the relief patterns 203 are aligned in the minor axis direction thereof as shown in FIG. 3B. The number of the relief patterns to be formed in the relief pattern group may not be limited as far as suitable printing can be performed, and the strength of the relief patterns may be maintained. The distances among the relief patterns 203 may be the same as each other or different from each other as far as they are within the aforementioned range of the adjacent distance, and similarly the widths of the relief patterns 203 may be the same as or different from each other. The relief patterns 203 are preferably in parallel to each other for facilitating the formation of the relief patterns 203 and maintaining the strength of the relief patterns 203 constant, and the relief patterns 203 are preferably in parallel to each other in both the arrangements shown in FIGS. 3A and 3B.

The ink used herein may have such a viscosity that is controlled in consideration of the feed of the ink from the ink feeding device used for applying the ink to the anilox roll to the anilox roll 103, the transfer of the ink from the anilox roll to the relief printing plate, the transfer of the ink from the relief printing plate to the substrate, and the drying of the ink in these process steps, and the viscosity of the ink is preferably from 5 to 120 mPa·s. When the viscosity of the ink exceeds 120 mPa·s, the aforementioned cupping and marginal phenomena may occur even though the relief printing plate having the relief pattern group 205 of the invention is used. When the viscosity of the ink is less than 5 mPa·s, unevenness due to repelling of the ink may occur within the pixel to cause printing defects. However, an ink having a viscosity outside the range may be used in the case where the aforementioned problems do not occur by controlling the solvent used and the like.

As an example of a production method of a circuit pattern by using a relief printing plate that is produced by pattern formation according to the invention, a production method of an organic EL device will be described, but the invention is not limited thereto.

Figure 9:
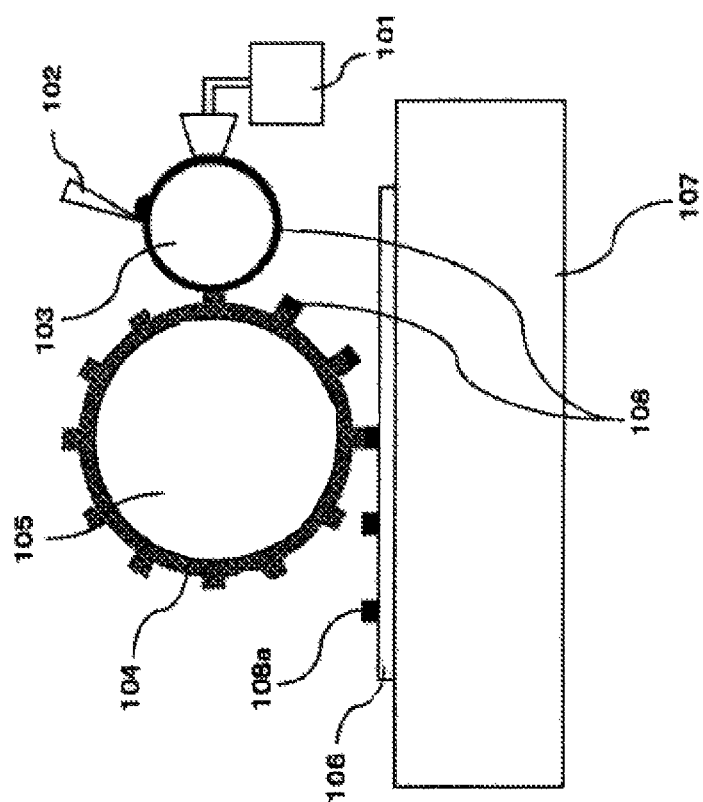
FIG. 9 is a schematic cross sectional view showing an example of a printing equipment using a relief printing plate according to the invention.

FIG. 9 is a schematic cross sectional view showing a printing equipment using the relief printing plate of the invention. A substrate 106 to be printed is fixed to a stage 107, a relief printing plate 104 having a pattern formed according to the invention is fixed to a plate cylinder 105, the relief printing plate 104 is in contact with an anilox roll 103 as an ink feeding member, and the anilox roll 103 has an ink feeding device 101 and a doctor blade 102.

An ink is fed from the ink feeding device 101 to the anilox roll 103, and the excessive portion of the ink 108 fed to the anilox roll 103 is removed with the doctor blade 102. As the ink feeding device 101, a dropping ink feeding device capable of feeding an ink to the anilox roll in a non-contact manner, for example, a coater, such as a fountain roll, a slit coater, a die coater and a cap coater, and combinations thereof, may be preferably used.

The doctor blade 102 may be a known alternative, such as a doctor roll. The anilox roll 103 may be one formed of chromium or ceramics. Instead of the anilox roll in the form of a cylinder, an anilox plate in the form of a flat plate may be used as an ink feeding member to the relief printing plate. The anilox plate in the form of a flat plate may be disposed, for example, at the position of the substrate 106 to be printed in FIG. 9, and after feeding the ink to the entire surface of the anilox plate with the ink feeding device, the ink is fed to the substrate to be printed by rotating the plate cylinder.

The ink thus retained uniformly with the doctor blade on the surface of the anilox roll 103 as an ink feeding member to the relief printing plate is then transferred and fed to the relief patterns 203 of the relief printing plate 104 attached to the plate cylinder 105. The relief patterns 203 of the relief printing plate 104 and the substrate are moved according to the rotation of the plate cylinder 105 while being in contact with each other, and thus the ink 108 is transferred to the prescribed position on the substrate 106 to be printed placed on the stage 107, thereby forming an ink pattern 108a on the substrate to be printed. After forming the ink pattern on the substrate to be printed, it may be subjected to a drying treatment with an oven depending on necessity.

On printing the ink on the relief printing plate onto the substrate to be printed, such a mechanism may be employed that the stage 107 having the substrate 106 to be printed fixed thereon is moved according to the rotation of the plate cylinder 105, or such a mechanism may be employed that a printing unit, which includes the plate cylinder 105, the relief printing plate 104, the anilox roll 103 and the ink feeding device 101 at the upper part of FIG. 9, is moved according to the rotation of the plate cylinder. The relief printing plate of the invention may be formed in such a manner that a resin layer is formed on the plate cylinder 105 and is directly made into a printing plate to form the relief patterns 203.

The printing equipment shown in FIG. 9 is a sheet-feed relief printing equipment where an ink pattern is formed on the substrate to be printed sheet by sheet, and in the case where the substrate to be printed is in the form of a web capable of being wound, a roll-to-roll relief printing equipment may be employed. The use of a roll-to-roll relief printing equipment enables continuous formation of an ink pattern, thereby decreasing the production cost.

Figure 10:
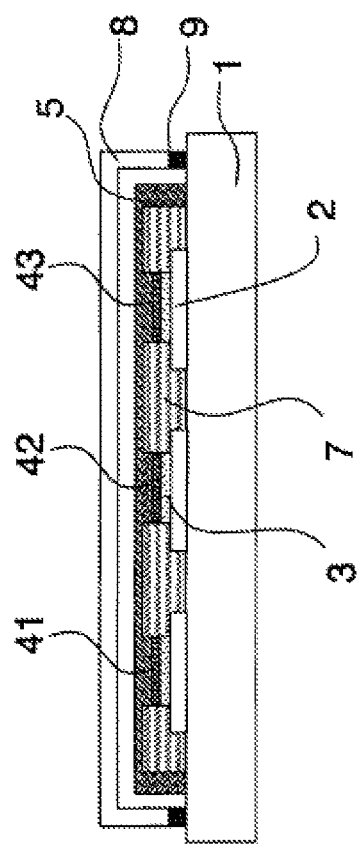
FIG. 10 is a schematic cross sectional view showing an example of an organic EL device produced in the invention.

As an example of a production method of a printed matter by using the relief printing plate of the invention, a production method of an organic EL device will be described, but the invention is not limited thereto. FIG. 10 is a schematic cross sectional view showing an organic EL device produced in the invention. The driving method of the organic EL device includes a passive matrix system and an active matrix system, and the organic EL device according to the invention may be applied to both a passive matrix organic EL device and an active matrix organic EL device.

The passive matrix system uses stripe electrodes that cross perpendicularly and face each other, and the intersecting points thereof emit light, whereas the active matrix system uses a so-called thin film transistor (TFT) substrate having transistors formed for respective pixels, and the respective pixels emit light independently.

As shown in FIG. 10, the organic EL device produced with the relief printing plate of the invention has a substrate 1 having thereon a first electrode 2 in a stripe form as an anode. A partition wall 7 is provided between the first electrodes 2, and preferably covers the end portions of the first electrodes 2 for preventing short circuit due to burrs on the end portions of the first electrodes 2.

The organic EL device produced with the relief printing plate of the invention has an organic EL layer, which is formed of an organic light emitting layer and a light emission assisting layer, in the region above the first electrode 2 demarcated with the partition wall 7 (i.e., the light emission region or the pixel portion). The organic EL layer held between electrodes may be one formed solely with an organic light emitting layer or one having a laminated structure containing an organic light emitting layer and a light emission assisting layer.

Examples of the light emission assisting layer include a hole transporting layer, a hole injection layer, an electron transporting layer, an electron injection layer and a charge generating layer. FIG. 10 shows a laminated structure containing a hole transporting layer 3 as a light emission assisting layer and organic light emitting layers 41, 42 and 43. The hole transporting layer 3 is formed on the first electrode 2, and the red (R) organic light emitting layer 41, a green (G) organic light emitting layer 42 and a blue (B) organic light emitting layer 43 are provided respectively on the hole transporting layer 3.

A second electrode 5 as a cathode is disposed on the organic light emitting layer to face the first electrode 2 as the anode. In the passive matrix system, the first electrode in a stripe form and the second electrode in a stripe form cross perpendicularly each other. In the active matrix system, the second electrode is formed on the entire surface of the organic EL device. Furthermore, a sealing member, such as a glass cap 8, is provided on the entire surface of the effective pixels for preventing water and oxygen in the environment from invading the first electrode, the organic light emitting layer, the light emission assisting layer and the second electrode, and is adhered to the substrate 1 through an adhesive 9.

The organic EL device produced with the relief printing plate of the invention contains at least a substrate, a first electrode that is supported by the substrate and is in the form of a pattern, an organic light emitting layer, and a second electrode. The organic EL device of the invention may have such a structure containing the first electrode as a cathode and the second electrode as an anode, which is reverse to the structure shown in FIG. 10.

Instead of the sealing member, such as a glass cap, the organic EL device may have a passivation layer for protecting the organic light emitting medium layer and an electrode from invasion of external oxygen and water, a protective layer for protecting them from an external stress, or a sealing material that has both the functions.

The substrate used may be any substrate that has insulating property. In the case where a bottom emission type organic EL device where light is taken out from the side of the substrate is produced, a transparent material is necessarily used as the substrate.

Examples of the substrate in this case include a glass substrate and a quartz substrate. The substrate may be a plastic film or sheet, such as polypropylene, polyether sulfone, polycarbonate, a cycloolefin polymer, polyacrylate, polyamide, polymethyl methacrylate, polyethylene terephthalate and polyethylene naphthalate. The substrate may be a laminated product containing the plastic film or sheet having laminated thereon a metal oxide thin film, a metal fluoride thin film, a metal nitride thin film, a metal oxynitride thin film or a polymer film for preventing water from invading the organic light emitting medium layer.

The substrate is preferably subjected to a heat treatment in advance, thereby decreasing as much as possible water adsorbed inside the substrate and on the surface thereof. The substrate is preferably used after subjecting to a surface treatment, such as an ultrasonic cleaning treatment, a corona discharge treatment, a plasma treatment and an UV ozone treatment, corresponding to the material to be laminated on the substrate, in order to improve adhesion.

Figure 11:
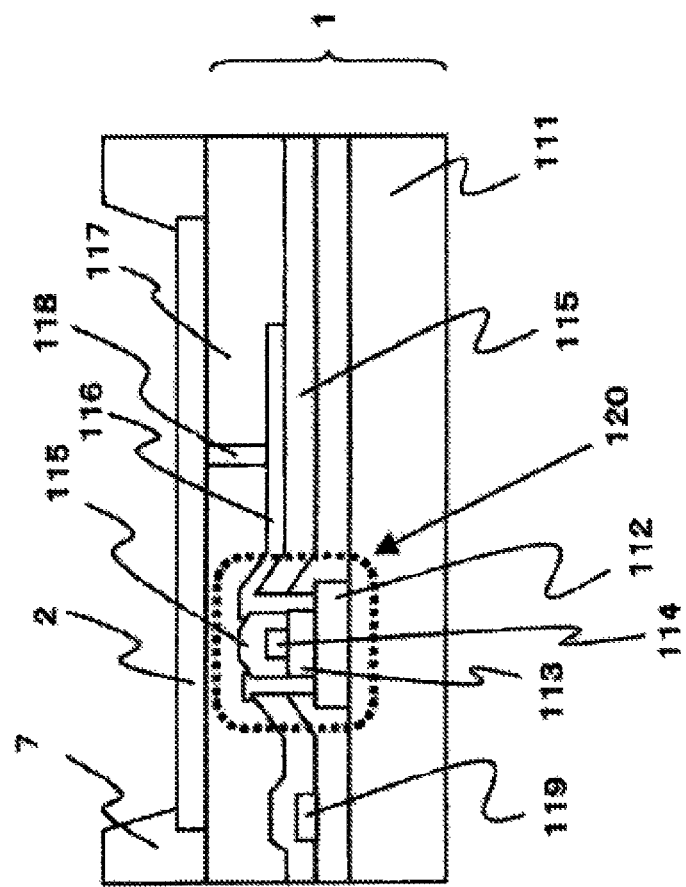
FIG. 11 is a schematic cross sectional view showing an example of an active matrix substrate used for producing an organic EL device according to the invention.

Furthermore, a substrate for an active matrix organic EL device may be produced by forming a thin film transistor (TFT) thereon. FIG. 11 is a schematic cross sectional view showing an active matrix substrate used for producing the organic EL device according to the invention. In the organic EL device substrate, it is preferred that a planarizing layer 117 is formed on a TFT 120, a lower electrode (first electrode 2) of the organic EL device is formed on the planarizing layer 117, and the TFT and the lower electrode are electrically connected to each other through a contact hole 118 provided in the planarizing layer 117. The structure provides excellent electric insulation between the TFT and the organic EL device.

The TFT 120 and the organic EL device provided thereabove are supported by a support 111. The support is preferably excellent in mechanical strength and dimensional stability, and specifically the materials having been described above for the substrate may be used therefor.

The TFT 120 provided on the support may be a known thin film transistor. Specific examples thereof include a thin film transistor constituted by an active layer containing a source/drain region and a channel region, a gate insulating film, and a gate electrode. The structure of the thin film transistor is not particularly limited, and examples thereof include a staggered type, a reverse staggered type, a top gate type, a bottom gate type and a coplanar type.

The active layer 112 is not particularly limited, and examples of the material therefor include an inorganic semiconductor material, such as amorphous silicon, polycrystalline silicon (polysilicon), microcrystalline silicon and cadmium selenide, and an organic semiconductor material, such as a thiophene oligomer and poly(p-phenylenevinylene).

The active layer may be formed, for example, by the following methods: amorphous silicon is accumulated by a plasma CVD method and then subjected to ion doping; amorphous silicon is formed by an LPCVD method with $SiH_4$ gas, and then crystallized by a solid phase growing method to provide polysilicon, which is then subjected to ion doping by an ion implantation method; amorphous silicon is formed by an LPCVD method with $Si_2H_6$ gas or by a PECVD method with $SiH_4$ gas, and annealed by a laser, such as an excimer laser, thereby crystallizing the amorphous silicon to provide polysilicon, which is then subjected to ion doping (low temperature process) by an ion doping method; or polysilicon is accumulated by a reduced pressure CVD method or an LPCVD method and thermally oxidized at 1,000° C. or more to form a gate insulating film, a gate electrode 114 of n+ polysilicon is formed thereon, and then ion doping is performed by an ion implantation method (high temperature process).

The gate insulating film 113 may be one that is ordinarily used as a gate insulating film, and examples thereof include $SiO_2$ formed by a PECVD method, an LPCVD method or the like, and $SiO_2$ obtained by thermal oxidation of a polysilicon film.

The gate electrode 114 may be one that is ordinarily used as a gate electrode, and examples thereof include a metal, such as aluminum and copper, a high melting point metal, such as titanium, tantalum and tungsten, polysilicon, and silicide and polycide of a high melting point metal.

The TFT 120 may have a single gate structure, a double gate structure or a multi-gate structure having three or more gate electrodes. The TFT 120 may also have an LDD structure or an offset structure. Two or more thin film transistors may be disposed in one pixel.

The thin film transistor (TFT) is necessarily connected to function as a switching device of the organic EL device, and the drain electrode 116 of the transistor and the pixel electrode (first electrode 2) of the organic EL device are electrically connected. For providing a top emission structure, furthermore, the pixel electrode is generally necessarily formed of a metal that reflects light.

The drain electrode 116 of the TFT 120 and the pixel electrode (first electrode 2) of the organic EL device are connected through an interconnection formed in a contact hole 118 penetrating through the planarizing film 117.

Examples of the material for the planarizing film 117 include an inorganic material, such as $SiO_2$, spin on glass, SiN ($Si_3N_4$) and TaO ($Ta_2O_5$), and an organic material, such as a polyimide resin, an acrylic resin, a photoresist material and a black matrix material. The formation method of the planarizing film 117 may be selected from a spin coating method, a CVD method, a vapor deposition method and the like depending on the material used therefor. The contact hole 118 is formed in the planarizing film 117 depending on necessity, for example, by such a method that the planarizing film is formed of a photosensitive resin, and the contact hole 118 is formed by a photolithography method, or the planarizing film is once formed on the entire surface, and the contact hole 118 is formed by dry etching, wet etching or the like at the position corresponding to the TFT 120 as an underlayer. The contact hole is then filled with an electroconductive material to connect electrically to the pixel electrode formed on the upper layer of the planarizing layer. The thickness of the planarizing layer may be such a thickness that can cover the TFT, a capacitor, an interconnection and the like as an underlayer, and may be several μm, for example, approximately 3 μm.

The first electrode 2 is provided on the substrate. In the case where the first electrode is used as an anode, examples of the material therefor include a metal oxide and a metal complex oxide, such as ITO (indium tin complex oxide), IZO (indium zinc complex oxide), tin oxide, zinc oxide, indium oxide and zinc aluminum complex oxide, and a metal, such as gold, platinum and chromium, which may be accumulated to a single layer structure or a multilayer structure. Examples of the formation method of the first electrode include dry film forming methods, such as a resistance heating vapor deposition method, an electron beam vapor deposition method, a reactive vapor deposition method, an ion plating method and a sputtering method, which may be selected depending on the material for the first electrode.

ITO is preferably used as the first electrode since ITO has low electric resistance and solvent resistance and has high transparency on using a bottom emission system. ITO may be formed by a sputtering method on a glass substrate and patterned by a photolithography method to form the first electrode 2.

After forming the first electrode 2, a partition wall 7 is formed to cover the edge portion of the first electrode. The partition wall 7 necessarily has insulating property, and may be formed of a photosensitive material. The photosensitive material may be a positive type or a negative type, and examples thereof include a photo-curable resin of a photo-radical polymerization system or a photo-cation polymerization system, a copolymer containing an acrylonitrile component, polyvinylphenol, polyvinyl alcohol, a novolak resin, a polyimide resin and cyanoethyl pullulan. $SiO_2$, $TiO_2$ and the like may also be used as the material for the partition wall.

In the case where the material for forming the partition wall is a photosensitive material, a solution of the material for forming the partition wall is subjected to the entire surface coating by a slit coating method or a spin coating method, and then patterned by a photolithography method including exposure and development. In the case where spin coating is employed, the height of the partition wall may be controlled by the conditions on spin coating, such as a rotation number, but since the height that can be formed only by a single coating operation is limited, the spin coating operation may be repeated for providing a partition wall having a larger height.

In the case where the partition wall is formed with a photosensitive material by a photolithography method, the shape of the partition wall may be controlled by the exposure conditions and the development conditions. For example, in the case where the partition wall is provided by coating a negative photosensitive resin and exposing, developing and post-baking the coated film, the development conditions, such as the kind, the concentration and the temperature of the developer solution, and the developing time, may be controlled to provide a forward tapered shape on the end of the partition wall. When the development conditions are mild, the end of the partition wall has a forward tapered shape, and when the development conditions are severe, the end of the partition wall has a reverse tapered shape.

In the case where the material for forming the partition wall is $SiO_2$ or $TiO_2$, the partition wall may be formed by a dry film forming method, such as a sputtering method and a CVD method. In this case, patterning of the partition wall may be performed by a mask method or a photolithography method.

The organic EL layer formed of an organic light emitting layer and a light emission assisting layer is then formed. The organic EL layer held between the electrodes may be constituted solely by an organic light emitting layer or may have a laminated structure containing an organic light emitting layer and a light emission assisting layer, such as a hole transporting layer, a hole injection layer, an electron transporting layer, an electron injection layer and a charge generating layer. The hole transporting layer, the hole injection layer, the electron transporting layer, the electron injection layer and the charge generating layer may be selected depending on necessity.

At least one layer of the organic EL layer, which is formed of an organic light emitting layer and a light emission assisting layer, such as a hole transporting layer, a hole injection layer, an electron transporting layer, an electron injection layer and a charge generating layer, may be used for printing an ink having a material of the organic EL layer dissolved or dispersed in a solvent above the first electrode by a relief printing method using the resin relief printing plate containing a substrate having thereon the relief patterns 203 formed of a resin as a printing plate. In the following description, the case where an organic light emitting ink containing an organic light emitting material dissolved or dispersed in a solvent is applied to the invention is described.

An organic light emitting layer is a layer that emits light on applying an electric current. Examples of the organic light emitting material for forming the organic light emitting layer include low molecular weight light emitting materials, such as a 9,10-diarylanthracene derivative, pyrene, coronene, perylene, rubrene, 1,1,4,4-tetraphenylbutadiene, tris(8-quinolate) aluminum complex, tris(4-methyl-8-quinolate) aluminum complex, bis(8-quinolate) zinc complex, tris(4-methyl-5-trifluoromethyl-8-quinolate) aluminum complex, tris(4-methyl-5-cyano-8-quinolate) aluminum complex, bis(2-methyl-5-trifluoromethyl-8-quinolinolate) [4-(4-cyanophenyl)phenolate) aluminum complex, bis(2-methyl-5-cyano-8-quinolinolate) [4-(4-cyanophenyl)phenolate] aluminum complex, tris(8-quinolinolate) scandium complex, bis[8-(p-tosyl)aminoquinoline) zinc complex and cadmium complex, 1,2,3,4-tetraphenylcyclopentadiene and poly-2,5-diheptyloxy-p-phenylenevinylene.

The material for forming the organic light emitting layer may also be a material containing a low molecular weight light emitting material, such as a coumarin fluorescent material, a perylene fluorescent material, a pyran fluorescent material, an anthrone fluorescent material, a porphyrin fluorescent material, a quinacridone fluorescent material, an N,N'-dialkyl-substituted quinacridone fluorescent material, a naphthalimide fluorescent material, an N,N'-diaryl-substituted pyrrolopyrrole fluorescent material, and a phosphorescent light emitting material, such as an Ir complex, dispersed in a polymer. Examples of the polymer used include polystyrene, polymethyl methacrylate and polyvinyl carbazole.

The material for forming the organic light emitting layer may also be a polymer light emitting material, such as a PPP derivative, e.g., poly(2-decyloxy-1,4-phenylene) (DO-PPP) and poly(2,5-bis(2-(N,N,N-triethylammonium)ethoxy)-1,4-phenyl-alt-phenylene) dibromide, poly(2-(2'-ethylhexyloxy)-5-methoxy-1,4-phenylenevinylene (MEH-PPV), poly (5-methoxy-(2-propanoxysulfide)-1,4-phenylenevinylene (MPS-PPV), poly(2,5-bis(hexyloxy)-1,4-phenylene-(1-cyanovinylene)) (CN-PPV), poly(9,9-dioctylfluorene) (PDAF) and polyspirofluorene.

The material for forming the organic light emitting layer may also be a polymer precursor, such as a PPV precursor and a PPP precursor. Other existing light emitting materials may also be used.

Examples of the hole transporting material constituting the hole transporting layer include a metal phthalocyanine compound, such as copper phthalocyanine and tetra(t-butyl) copper phthalocyanine, a metal-free phthalocyanine compound, a quinacridone compound, an aromatic amine low molecular weight hole injection and transporting material, such as 1,1-bis(4-di-p-tolylaminophenyl)cyclohexane, N,N'-diphenyl-N,N'-bis(3-methylphenyl)-1,1'-biphenyl-4,4'-diamine and N,N'-di(1-naphthyl)-N,N'-diphenyl-1,1'-biphenyl-4,4'-diamine, a polymer hole transporting material, such as polyaniline, polythiophene, polyvinyl carbazole, and a mixture of poly(3,4-ethylenedioxythiophene) and polystyrenesulfonic acid, a thiophene oligomer material, and other existing hole transporting materials.

Examples of the electron transporting material constituting the electron transporting layer include an oxadiazole derivative, such as 2-(4-biphenyl)-5-(4-tetrabutylphenyl)-1,3,4-oxadiazole and 2,5-bis(1-naphthyl)-1,3,4-oxadiazole, bis(10-hydroxybenzo[h]quinolinolate) beryllium complex and a triazole compound.

Examples of the solvent for dissolving or dispersing the organic light emitting material include toluene, xylene, acetone, hexane, methyl ethyl ketone, methyl isobutyl ketone, cyclohexanone, methanol, ethanol, isopropyl alcohol, ethyl acetate, butyl acetate, 2-methyl-(t-butyl)benzene, 1,2,3,4-tetramethylbenzene, pentylbenzene, 1,3,5-triethylbenzene, cyclohexylbenzene and 1,3,5-triisopropylbenzene, which may be used solely or as a mixture thereof. The organic light emitting ink may further contain a surfactant, an antioxidant, a viscosity modifier, an ultraviolet ray absorbent and the like depending on necessity.

Examples of the solvent for dissolving or dispersing the hole transporting material and the electron transporting material include toluene, xylene, acetone, methyl ethyl ketone, methyl isobutyl ketone, cyclohexanone, methanol, ethanol, isopropyl alcohol, ethyl acetate, butyl acetate, water and mixed solvents thereof. In particular, when the hole transporting material is formed into an ink, water or an alcohol is preferred as the solvent.

The organic light emitting layer and the light emission assisting layer may be formed by a wet film forming method. In the case where the layers have a multilayer structure, all the layers need not be formed by a wet film forming method. Examples of the wet film forming method include a coating method, such as a spin coating method, a die coating method, a dip coating method, an extrusion coating method, a precoating method, a roll coating method and a bar coating method, and a printing method, such as a relief printing method, an ink-jet printing method, an offset printing method and a gravure printing method. A relief printing method is excellent in pattern formation accuracy and film thickness uniformity on forming patterns of organic light emitting layers for RGB three colors, and an organic EL device capable of performing color display can be produced by forming the organic light emitting layers for RGB three colors selectively on the pixel portions. The thickness of the organic light emitting medium layer may be 1,000 nm or less, and preferably from 50 to 150 nm, in both cases of a single layer structure and a multilayer structure.

The relief printing plate of the invention may be applied not only to the case where the organic light emitting layer is formed with an organic light emitting ink by a relief printing method, but also to the case where a light emission assisting layer such as a hole transporting layer or an electron transporting layer is formed with a hole transporting ink or an electron transporting ink by a relief printing method.

The second electrode is then formed. In the case where the second electrode is used as a cathode, a substance having a high electron injection efficiency may be used as a material therefor. Specifically, an elemental substance of metal, such as Mg, Al and Yb, may be used, or Al or Cu having high stability and conductivity may be accumulated on the interface in contact with the light emitting medium with Li or a Li compound, such as Li oxide and LiF, in a thickness of approximately 1 nm intervening between them. For achieving both the electron injection efficiency and the stability, an alloy system of at least one metal having a low work function, such as Li, Mg, Ca, Sr, La, Ce, Er, Eu, Sc, Y and Yb, and a stable metal element, such as Ag, Al and Cu, may be used. Specifically, an alloy such as MgAg, AlLi and CuLi may be used. In the case of producing a top emission type organic EL device, the cathode necessarily has transparency, and for example, a combination of these metals and a transparent conductive layer, such as ITO, may impart transparency thereto.

Examples of the formation method of the second electrode include a dry film forming method, such as a resistance heating vapor deposition method, an electron beam vapor deposition method, a reactive vapor deposition method, an ion plating method and a sputtering method, depending on the material therefor. In the case where the second electrode is patterned, the second electrode may be patterned with a mask or the like. The thickness of the second electrode is preferably from 10 to 1,000 nm. In the invention, the first electrode may be also used as a cathode, and the second electrode may be also used as an anode.

The organic EL device can emit light by holding the organic light emitting layer between the electrodes and applying an electric current thereto, and since some of the organic light emitting material, the material for forming the light emission assisting layer and the electrode forming material are easily deteriorated with water and oxygen in the air, a sealing member is generally provided for sealing them from the external environment.

The sealing member may be, for example, a glass cap or a metal cap having a concave portion and may be placed on the substrate having thereon the first electrode, the organic light emitting layer, the light emission assisting layer and the second electrode, in such a manner that the concave portion is above the first electrode, the organic light emitting medium layer and the second electrode, and the peripheral portion of the cap may be adhered to the substrate with an adhesive to perform sealing.

The sealing member may be a sealing material having provided thereon a resin layer, which may be placed on the substrate having thereon the first electrode, the organic light emitting layer, the light emission assisting layer and the second electrode, and the sealing material and the substrate may be adhered with the resin layer.

The sealing material herein is necessarily a substrate having low permeability to water and oxygen. Examples of the material therefor include ceramics, such as alumina, silicon nitride and boron nitride, glass, such as non-alkali glass and alkali glass, quartz, a metal foil, such as aluminum and stainless steel, and a moisture resistant film. Examples of the moisture resistant film include a film containing a plastic substrate having formed on both surfaces thereof. $SiO_x$ by a CVD method, and a polymer film containing a film having small permeability having adhered thereon a film having water absorbing property or having coated thereon a water absorbing agent, and the water vapor permeability of the moisture resistant film is preferably $10^{-6}$ g/m²·day or less.

Examples of the resin layer include a photo-curable adhesive resin formed of an epoxy resin, an acrylic resin, a silicone resin or the like, a thermosetting adhesive resin, a two-component curing adhesive resin, a thermoplastic resin, such as an acrylic resin, e.g., an ethylene-ethyl acrylate (EEA) copolymer, a vinyl resin, e.g., an ethylene-vinyl acetate (EVA), polyamide and synthetic rubber, and a thermoplastic adhesive resin, such as acid-modified products of polyethylene and polypropylene. Examples of the method for forming the resin layer on the sealing material include a solvent solution method, an extrusion lamination method, a hot-melt method, a calendering method, a nozzle coating method, a screen printing method, a vacuum lamination method and a heat roll lamination method. The resin layer may contain a material having moisture absorbing property or oxygen absorbing property depending on necessity. The thickness of the resin layer formed on the sealing material may be arbitrarily determined depending on the size and shape of the organic EL device to be sealed, and is preferably approximately from 5 to 500 μm.

The substrate having thereon the first electrode, the organic light emitting layer, the light emission assisting layer and the second electrode and the sealing member are adhered in a sealing chamber. In the case where the sealing member has a two-layer structure containing the sealing material and the resin layer, and a thermoplastic resin is used in the resin layer, the sealing member is preferably adhered only by pressing with a heated roll. In the case where a thermosetting adhesive resin is used, the sealing member is preferably adhered by pressing with a heated roll and then further heated for curing at a curing temperature. In the case where a photo-curable adhesive resin is used, the sealing member may be adhered by pressing with a roll and then irradiated with light for curing. The resin layer is formed on the sealing material herein, and the resin layer may be formed on the substrate and then adhered to the sealing material.

Before sealing with the sealing member or instead of the use of the sealing member, an inorganic thin film may be used as the sealing member, for example, a passivation film, such as a silicon nitride film having a thickness of 150 nm, may be formed by a CVD method, and the sealing members may be used in combination.

The aforementioned process with the relief printing plate of the invention enables production of an organic EL device having good light emitting pattern accuracy.

Examples and comparative examples of the invention will be described below, but the invention is not limited thereto.

EXAMPLE

Example 1

Production of Photosensitive Resin Relief Printing Plate 104

A 42 nickel material having a thickness of 250 μm was used as a substrate 204, and an acrylic binder resin solution having a black pigment kneaded therein was coated on the substrate 204 to make a dry thickness of 10 μm, followed by drying, thereby forming an antireflection layer.

A photosensitive resin composition formed by kneading a water soluble polyamide as a major component, dipentaerythritol hexakisacrylate as a radical polymerizable monomer and 2,2-dimethoxy-1,2-diphenylethan-1-one (produced by Ciba Specialty Chemicals Co., Ltd.) as a photopolymerization initiator was melt-coated on the surface of the substrate 204 to make a total thickness of the plate of 310 μm, thereby producing a photosensitive resin layer, on which a polyethylene terephthalate film (thickness: 125 μm, produced by Teij in DuPont Films Japan Ltd.) having a polyvinyl alcohol solution coated thereon to make a dry thickness of 1 μm was laminated.

A chromium mask of a synthetic quartz substrate was used as an original plate of the resin relief printing plate, and the resin relief was exposed with the mask set in a proximity exposure machine, thereby producing a photosensitive resin relief printing plate 104 having the pattern shape shown in FIG. 2A. The relief pattern 203 thus produced had a thickness of 50 μm, and two relief patterns 203 each having a width of 35 μm were formed with a distance of 20 μm, thereby forming a relief pattern group 205 having a width of 90 μm.

Production of Substrate 106 to be Printed

As the substrate 106 used to be printed, an active matrix substrate containing a support having provided thereon a thin film transistor functioning as a switching device, a planarizing layer formed thereon, and a pixel electrode that was formed on the planarizing layer and electrically connected to the thin film transistor through a contact hole, was used. The pixel size was 130 μm×450 μm.

A partition wall was formed to cover the end of the pixel electrode provided on the active matrix substrate and to demarcate the pixels. The partition wall was formed in such a manner that Posiresist ZWD6216-6, produced by Nippon Zeon Corporation, was coated on the entire surface of the active matrix substrate to make a dry thickness of 1 μm with a spin coater, and a partition wall having a line width of 20 μm was formed on the four edges of each pixel portion by photolithography.

A 1.5 wt % aqueous solution of poly(3,4-ethylenedioxythiophene)/polystyrenesulfonic acid (PEDOT/PSS) was coated as a hole transporting layer on the pixel electrode to make a thickness of 100 nm by a spin coating method. The PEDOT/PSS thin film thus formed was dried under reduced pressure at 100° C. for one hour, thereby providing a substrate 106 to be printed.

Production of Inks for forming Organic Light Emitting Layers

The organic light emitting inks of three colors of red, green and blue (R, G and B) were each prepared by dissolving light emitting materials in xylene. The red light emitting ink (R) was a toluene solution of a polyfluorene derivative (red light emitting material, Red 1100, a trade name, produced by Sumitomo Chemical Co., Ltd.). The green light emitting ink (G) was a toluene solution of a polyfluorene derivative (green light emitting material, Green 1300, a trade name, produced by Sumitomo Chemical Co., Ltd.). The blue light emitting ink (B) was a toluene solution of a polyfluorene derivative (blue light emitting material, Blue 1100, a trade name, produced by Sumitomo Chemical Co., Ltd.). The inks each had a viscosity of 50 mPa·s.

Printing Process

The photosensitive resin relief printing plate 104 was fixed to a plate cylinder 105 of a sheet-feed relief printing machine. The organic light emitting ink was then fed to an ink tank of the relief printing machine, and coated on a honeycomb anilox roll 103 having 600 lines per inch through an ink ejection port. The ink was scraped with a doctor blade 102 and applied to the line pattern of the relief pattern group 205 of the photosensitive resin relief printing plate 104. The photosensitive resin relief printing plate 104 thus applied with the ink was pressed onto the substrate 106 to be printed and rolled thereon to print a stripe pattern on the substrate 106 to be printed. The process was repeated for each of the red organic light emitting layer, the green organic light emitting layer and the blue organic light emitting layer, thereby providing an organic light emitting pattern. After printing for the respective colors, the ink was dried in an oven at 130° C. for one hour.

After drying, calcium was formed as a film having a thickness of 10 nm on the organic light emitting layer formed by printing, silver was then vapor-deposited thereon as a film having a thickness of 300 nm, and finally the substrate was sealed with a glass cap, thereby producing an organic electroluminescence (EL) display device.

Example 2

In Example 2, a device was produced in the same manner as in Example 1 except that the relief pattern 203 thus produced had a width of 25 two relief patterns were formed with a distance of 10 μm to form a relief pattern group 205 having a width of 60 the pixel size was 80 μm×150 μm, the organic light emitting inks used had a viscosity of 120 mPa·s, and 20 substrates were continuously printed in the printing process.

Comparative Example 1

In Comparative Example 1, a device was produced in the same manner as in Example 1 except that the relief pattern 203 of the photosensitive resin relief printing plate 104 was formed to have a width of 90 μm, and no other relief pattern was formed adjacently thereto.

Comparative Example 2

In Comparative Example 2, a device was produced in the same manner as in Example 1 except that the relief pattern 203 of the photosensitive resin relief printing plate 104 had a height of 9 μm.

Comparative Example 3

In Comparative Example 3, a device was produced in the same manner as in Example 1 except that the distance between the relief patterns 203 adjacent to each other in the relief pattern group 205 of the photosensitive resin relief printing plate 104 was 50 μm.

Comparative Example 4

In Comparative Example 4, a device was produced in the same manner as in Example 2 except that only one relief pattern 203 having a width of 60 μm was formed, but a relief pattern group 205 was not formed.

The devices produced in Example 1 and Comparative Examples 1 to 3 were observed inside the pixel with a fluorescent microscope, and the devices were turned on for light emitting and observed for the light emitting state. The results are shown in Table 1 below. For the devices produced in Example 2 and Comparative Example 4, the devices printed as the first sheet and the device printed as the twentieth sheet by a relief printing method were observed inside the pixel with a fluorescent microscope, and the devices were turned on for light emitting and observed for the light emitting state. The results are shown in Table 2 below.

TABLE 1

| | Observation with fluorescent microscope | Light emission unevenness |
|---|---|---|
| Example 1 | good | none |
| Comparative Example 1 | defective (cupping and marginal phenomena in lines) | observed |
| Comparative Example 2 | defective (unevenness due to ink flowing between relief patterns) | observed |
| Comparative Example 3 | defective (drop off due to breakage between relief patterns) | observed |

TABLE 2

| | Device of first sheet | | Device of twentieth sheet | |
|---|---|---|---|---|
| | Observation with fluorescent microscope | Light emission unevenness | Observation with fluorescent microscope | Light emission unevenness |
| Example 2 | good | none | good | none |
| Comparative Example 4 | good | none | defective (cupping and marginal phenomena) | observed |

Comparison Results

It was understood from comparison between Examples 1 and 2 and Comparative Examples 1 to 4 that in Examples 1 and 2 according to the invention provided good printed patterns without printing defects, and good results without light emission unevenness.

What is claimed is:

1. A method for producing an organic EL device including a substrate having thereon a pixel electrode,
   a plurality of pixels that are demarcated with a partition wall on the pixel electrode,
   a light emitting medium layer having a light emitting layer containing at least an organic light emitting material on the pixels,
   and
   a counter electrode facing the pixel electrode,
   the method comprising
   a step of transferring an ink containing a light emitting medium material and a solvent to the pixels by a relief printing method to form the light emitting medium layer, the ink used in the relief printing method being transferred from two or more adjacent relief patterns within one of the pixels and being integrated by flow thereof to form the light emitting medium layer,
   wherein, in the relief printing, the ink is onto only the two or more adjacent relief patterns, and the ink is not filled in a groove(s) between the two or more adjacent relief patterns.

2. The method for producing an organic EL device according to claim 1, wherein the ink has a viscosity of from 5 to 120 mPa·s.

3. A relief printing plate used in the method for producing an organic EL device according to claim 1, wherein the relief printing plate comprises a plate substrate, the two or more adjacent relief patterns are formed on the plate substrate, and a relief pattern group contains the two or more adjacent relief patterns.

4. The relief printing plate according to claim 3, wherein the two or more adjacent relief patterns have a height of 10 μm or more.

5. The relief printing plate according to claim 3, wherein a distance between the two or more adjacent relief patterns is from 10 to 40 μm.

6. The relief printing plate according to claim 4, wherein a distance between the two or more adjacent relief patterns is from 10 to 40 μm.

7. The relief printing plate according to claim 3, wherein the relief pattern group has a width of from 60 to 500 μm.

8. The relief printing plate according to claim 4, wherein the relief pattern group has a width of from 60 to 500 μm.

9. The relief printing plate according to claim 5, wherein the relief pattern group has a width of from 60 to 500 μm.

10. The relief printing plate according to claim 6, wherein the relief pattern group has a width of from 60 to 500 μm.

* * * * *